United States Patent
Choi et al.

(10) Patent No.: US 10,271,447 B2
(45) Date of Patent: Apr. 23, 2019

(54) CARD HOLDING DEVICE AND ELECTRONIC DEVICE HAVING THE SAME

(71) Applicant: Samsung Electronics Co., Ltd., Gyeonggi-do (KR)

(72) Inventors: Manki Choi, Daegu (KR); Jaeryong Han, Gyeonggi-do (KR); Minsoo Kim, Gyeongsangbuk-do (KR); Jinwan An, Daegu (KR); Jiwoo Lee, Gyeongsangbuk-do (KR); Heedong Lee, Gyeongsangbuk-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/708,811

(22) Filed: Sep. 19, 2017

(65) Prior Publication Data

US 2018/0092231 A1 Mar. 29, 2018

(30) Foreign Application Priority Data

Sep. 27, 2016 (KR) .................. 10-2016-0123900

(51) Int. Cl.
*H05K 5/02* (2006.01)
*H04B 1/3816* (2015.01)
*H04B 1/3818* (2015.01)
*H05K 5/00* (2006.01)

(52) U.S. Cl.
CPC ......... *H05K 5/0286* (2013.01); *H04B 1/3818* (2015.01); *H04B 1/3816* (2013.01); *H05K 5/0017* (2013.01)

(58) Field of Classification Search
CPC ........................ H05K 5/0286; H04B 1/3816
See application file for complete search history.

(56) References Cited

U.S. PATENT DOCUMENTS

| 5,125,505 | A | * | 6/1992 | Kurosaki | A45C 11/182 206/38 |
| 6,261,113 | B1 | * | 7/2001 | Chen | G06K 7/0021 439/260 |
| 6,808,424 | B2 | * | 10/2004 | Kaneshiro | G06K 7/0021 439/630 |
| 6,991,172 | B2 | | 1/2006 | Luu | |
| 7,125,258 | B2 | * | 10/2006 | Nakakubo | G06K 19/07741 439/64 |
| 7,445,510 | B2 | * | 11/2008 | Feng | H01R 12/7058 439/630 |

(Continued)

FOREIGN PATENT DOCUMENTS

| KR | 20030038432 | 5/2003 |
| KR | 100606056 | 7/2006 |

(Continued)

OTHER PUBLICATIONS

International Search Report dated Dec. 18, 2017 issued in counterpart application No. PCT/KR2017/010023, 3 pages.

*Primary Examiner* — Xanthia C Cunningham
(74) *Attorney, Agent, or Firm* — The Farrell Law Firm, P.C.

(57) ABSTRACT

A card holding device and an electronic device having the same are provided. The card holding device of an electronic device includes a tray body having a card receiving portion that can receive at least one card, and a card elastic pressing portion configured to prevent movement of a card inserted and received in the card receiving portion.

16 Claims, 13 Drawing Sheets

(56) References Cited

U.S. PATENT DOCUMENTS

| | | | | |
|---|---|---|---|---|
| 8,233,949 B2* | 7/2012 | Li | ............... | G06K 7/0021 |
| | | | | 455/558 |
| 8,654,535 B2* | 2/2014 | Lin | ............... | G06K 19/07741 |
| | | | | 361/737 |
| 8,794,986 B2* | 8/2014 | Takasaki | ............... | H01R 12/721 |
| | | | | 439/157 |
| 9,048,594 B2* | 6/2015 | Lim | ............... | H01R 27/00 |
| 9,106,310 B2* | 8/2015 | Dondzik | ............... | H04B 1/3888 |
| 9,373,905 B2* | 6/2016 | Liu | ............... | G06K 7/0052 |
| 9,544,000 B2* | 1/2017 | Hirata | ............... | H04B 1/3816 |
| 9,632,544 B2* | 4/2017 | Heiskanen | ............... | G06F 1/1656 |
| 9,647,359 B2* | 5/2017 | Cho | ............... | H04B 1/3816 |
| 9,652,639 B2* | 5/2017 | Motohashi | ............... | G06K 7/0056 |
| 9,706,676 B2* | 7/2017 | Moon | ............... | H04B 1/3816 |
| 9,875,432 B2* | 1/2018 | Motohashi | ............... | G06K 13/0831 |
| 2004/0198444 A1 | 10/2004 | Chen | | |
| 2012/0276765 A1 | 11/2012 | Nakase et al. | | |
| 2014/0049920 A1 | 2/2014 | Sloey et al. | | |
| 2014/0099805 A1* | 4/2014 | Kutchery | ............... | H04B 1/3816 |
| | | | | 439/76.1 |
| 2014/0104767 A1* | 4/2014 | Sutherland | ............... | H04B 1/3816 |
| | | | | 361/679.02 |
| 2014/0113495 A1* | 4/2014 | Lim | ............... | H01R 27/00 |
| | | | | 439/630 |
| 2014/0307401 A1* | 10/2014 | Wu | ............... | H04B 1/3816 |
| | | | | 361/759 |
| 2015/0079847 A1* | 3/2015 | Liu | ............... | H01R 12/721 |
| | | | | 439/630 |
| 2015/0200479 A1* | 7/2015 | Rhee | ............... | H04B 1/3816 |
| | | | | 439/607.35 |
| 2016/0028172 A1* | 1/2016 | Motohashi | ............... | H01R 12/716 |
| | | | | 439/160 |
| 2016/0111801 A1* | 4/2016 | Zeng | ............... | H01R 12/7076 |
| | | | | 439/660 |
| 2016/0164204 A1* | 6/2016 | Cho | ............... | H04B 1/3816 |
| | | | | 439/152 |
| 2016/0164226 A1* | 6/2016 | Hirata | ............... | H04B 1/3816 |
| | | | | 439/155 |
| 2017/0077629 A1* | 3/2017 | Ferenczi | ............... | G06K 7/00 |

FOREIGN PATENT DOCUMENTS

| | | |
|---|---|---|
| KR | 10-0628114 | 9/2006 |
| KR | 1020120068997 | 6/2012 |
| KR | 10-1586252 | 1/2016 |

* cited by examiner

A LITTLE SMALLER CARD $\ell'/2$

STANDARD SPECIFICATION SIZE CARD $\ell''/2$

A LITTLE LARGER CARD

CARD HOLDING DEVICE AND ELECTRONIC DEVICE HAVING THE SAME

PRIORITY

This application claims priority under 35 U.S.C. § 119(a) to Korean Patent Application Ser. No. 10-2016-0123900, which was filed in the Korean Intellectual Property Office on Sep. 27, 2016, the entire content of which is incorporated herein by reference.

BACKGROUND

1. Field of the Invention

The present disclosure relates to a configuration of a card holding device that can effectively hold a card received in an electronic device, particularly a mobile device.

2. Description of the Related Art

Electronic communication technologies are applied to various aspects of daily life. Particularly, a mobile communication terminal is a representative electronic device with a processing speed that is rapidly growing. The mobile communication terminal has various additional functions such as web surfing.

Further, electronic devices are designed in various sizes according to the desired functionality and user preferences. Even if electronic devices from several companies have the same or similar features, a user tends to prefer the electronic device having a thin design with a small size.

As electronic devices advance to a thin design, an external device that can perform additional functions may be detachably attached to the electronic device to add additional functionality.

A memory card such as a secure digital (SD) card, mini SD card, and micro SD card can be an external device that extends the storage space of an electronic device. A personal identification card, such as a subscriber identification module (SIM) card, may be detachably attached to the electronic device so that multiple users can use a single electronic device.

External devices can be configured in a card type that may have a thin design and that minimize the required mounting space. The external device may have a separate slot to selectively insert the cards to be used by the electronic device. For an electronic device with a thin design, it may be necessary to efficiently use a mounting space for attaching and detaching various sizes of card type external devices.

In a conventional SIM/SD card tray type socket, a holding structure for the mounted SIM/SD card does not exist, and because the holding structure does not exist, the card does not come in close contact with the tray and maintains a separated state; thus, the card may be dropped from the electronic device. For other tray type sockets, there is a tray with a structure in which both surfaces are received or a tray to which an overlap design is applied, but because the tray for both surface receiving structures has a structure that holds a card with two ribs and one protrusion, there is no structure that holds a received card at the low end; thus, there is a problem that the card can drop from the electronic device due to the effect of gravity. Even in a tray to which an overlap design is adapted, when a mold is abraded, there is a problem that a holding force changes, and when a gap difference occurs because of the insertion of various sizes of cards, it is impossible to hold the card. Thus, an entire socket may be damaged.

Further, in a structure of connecting two ribs by forming a protrusion in an intermediate portion, when an excess stress exceeding a prescribed pressing amount is applied to a rib from any one side, the rib may be damaged. Even if a holding structure is formed in an outer edge portion, a crack can occur in a tray injection portion from the repeated mounting/removing of the card, and after such a crack occurs in an injection portion, an entire socket may be damaged.

SUMMARY

The present disclosure has been made in view of the above problem and provides a card holding device and an electronic device having the same that can prevent a drop or separation phenomenon caused by the effects of gravity on an inserted card. Even if the card mounting/removing is repeated and an effective holding structure can be implemented, then various sizes of cards can be received that can minimize an abrasion phenomenon in a fixed structure of a tray injection portion.

In accordance with an aspect of the present disclosure, a card holding device for an electronic device includes a tray body having a card receiving portion that can receive at least one card, and a card elastic pressing portion configured to prevent movement of a card inserted and received in the card receiving portion.

In accordance with another aspect of the present disclosure, an electronic device includes a first surface including a display, a second surface facing the first surface, a side surface, between the first surface and the second surface, in which a housing port is installed, and a card holding device inserted into the housing port, wherein the card holding device includes a tray body having a card receiving portion that can hold at least one card, a card support portion configured to be protruded from the tray body toward the card receiving portion to support a card received in the card receiving portion, and a card elastic pressing portion configured to prevent movement of a card inserted and received in the card receiving portion.

BRIEF DESCRIPTION OF THE DRAWINGS

The objects, features, and advantages of the present disclosure will be more apparent from the following detailed description in conjunction with the accompanying drawings, in which.

DETAILED DESCRIPTION

Figure 1A:
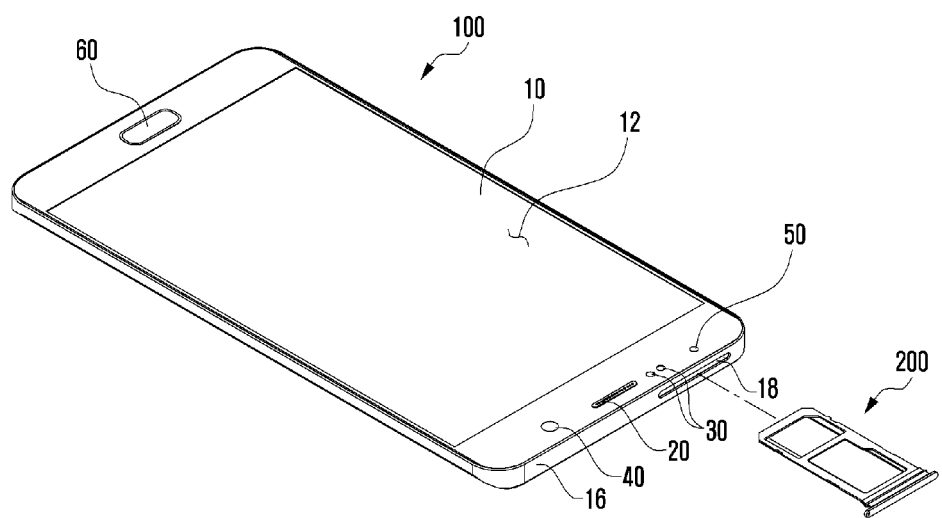
FIG. 1A is a perspective view illustrating a front surface of an electronic device having a card holding device according to embodiments of the present disclosure.

The expressions such as "include" and "may include" which may be used in the present disclosure denote the presence of disclosed functions, operations, and constituent elements, and do not limit one or more additional functions, operations, and constituent elements. In the present disclosure, terms such as "include" and/or "have" may be construed to denote a certain characteristic, number, step, operation, constituent element, component, or a combination thereof, but may not be construed to exclude the existence of or a possibility of the addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first", "second", and the like, may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. A first element may be referred to as a second element, and similarly, a second element may also be referred to as a first element without departing from the scope of the present disclosure.

In the case where a component is referred to as being "connected" or "attached" to other component, it should be understood that not only the component is directly connected or attached to the other component, but also there may exist another component between them. Meanwhile, in the case where a component is referred to as being "directly connected" or "directly attached" to other component, it should be understood that there is no intervening component. The terms used in the present disclosure are only used to describe certain embodiments, and are not intended to limit the present disclosure. As used herein, the singular forms are intended to include the plural forms as well, unless the context clearly indicates otherwise.

An electronic device according to the present disclosure may be a device including a communication function. For example, the device corresponds to of at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, a vacuum, an oven, a microwave, a washing machine, an air cleaner, and the like), an artificial intelligence robot, a television (TV), a digital video disk (DVD) player, an audio device, various medical devices (for example, magnetic resonance angiography (MRA), magnetic resonance imaging (MRI), computed tomography (CT), a scanning machine, a ultrasonic wave device, and the like), a navigation device, a global positioning system (GPS) receiver, an event data recorder (EDR), a flight data recorder (FDR), a set-top box, a TV box (for example, Samsung HomeSync™, Apple TV™, and Google TV™), an electronic dictionary, vehicle infotainment device, an electronic equipment for a ship (for example, navigation equipment for a ship, gyrocompass, and the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

FIG. 1A is a perspective view illustrating an electronic device having a card holding device according to embodiments of the present disclosure.

With reference to FIG. 1A, an electronic device according to embodiments of the present disclosure may correspond to a mobile communication terminal (hereinafter, terminal) as a typical electronic device. A communication terminal illustrated as electronic device 100 may be a terminal with a battery. A front surface of the electronic device 100 is referred to as a first surface 12, a rear surface is referred to as a second surface 14 (See FIG. 1B), and a display 10 may be installed in the first surface 12. In an upper portion of the display 10, a receiver or speaker 20 for receiving the voice of another party may be disposed.

According to an embodiment of the present disclosure, at a periphery of the receiver 20, components for performing various functions of the electronic device 100 may be disposed. The components may include a sensor module 30, such as an illumination sensor (e.g., optical sensor), a proximity sensor (e.g., optical sensor), an infrared sensor, and an ultrasonic sensor, and a front camera device 40. The components may include an indicator 50 for communicating state information of the electronic device 100 to a user.

According to embodiments of the present disclosure, at the first surface 12 of the electronic device 100, in at least a partial area of a lower area, except for the display 10, at least one key button 60 may be disposed. The key button 60 may perform a home key button function, and at an upper surface thereof, a fingerprint recognition sensor may be disposed. The home key button 60 may perform a first function (e.g., home screen return function, wake up/sleep function) by a physical pressing operation, and perform a second function (e.g., fingerprint recognition function) by the operation of swiping the upper surface. To the left and the right of the home key button 60, a touch pad may be disposed to perform a touch function.

Figure 1B:
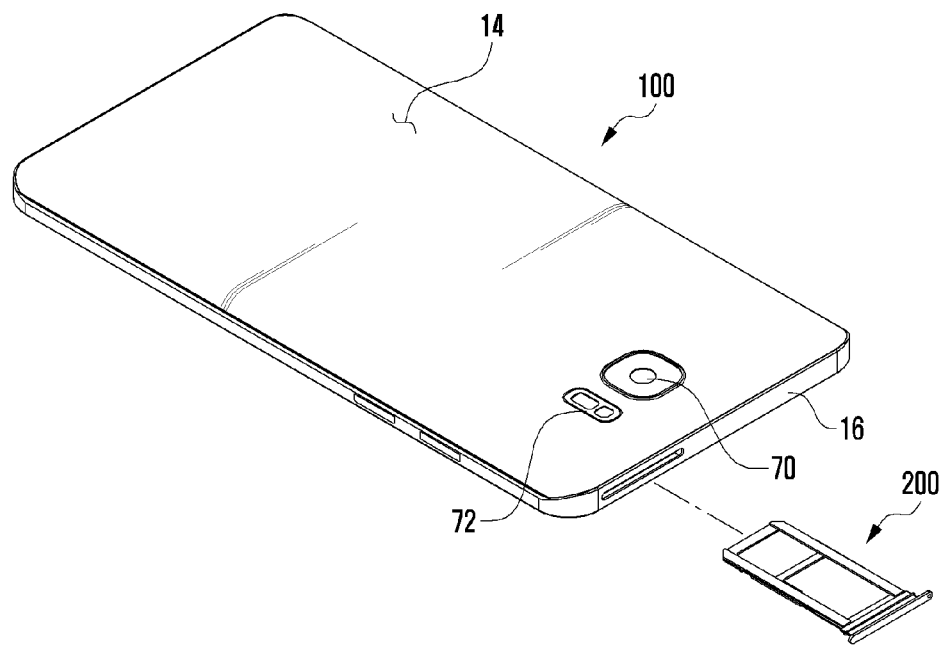
FIG. 1B is a perspective view illustrating a rear surface of an electronic device having a card holding device according to embodiments of the present disclosure.

With reference to FIG. 1B, at the second surface 14 of the electronic device 100, a rear camera device 70 may be disposed, and at one side of the rear camera device 70, an electronic component 72 may include an illumination sensor (e.g., optical sensor), a proximity sensor (e.g., optical sensor), an infrared sensor, an ultrasonic sensor, a heartbeat sensor, a flash device, and the like.

At a side surface 16 between the first surface 12 and the second surface 14 of the electronic device 100, a housing port 18 for inserting a card type external device may be disposed. According to an embodiment of the present disclosure, the housing port 18 may be disposed at an upper side surface between the first surface 12 and the second surface 14 of the electronic device 100. However, the present disclosure is not limited thereto and components may be disposed at a lower side surface, left side surface, and right side surface, and at one side of the housing port 18, an infrared sensor module and an auxiliary microphone may be disposed, and a card holding device 200 may be inserted into the housing port 18.

The card holding device 200 may be mounted in a direction of the housing port 18 or may be installed in an opposite direction thereof. According to an embodiment of the present disclosure, the housing port 18 may be installed at a position corresponding to a socket disposed within the electronic device 100, and when the card holding device 200 is inserted into the housing port, the card holding device 200 may be physically and electrically connected to a plurality of corresponding connectors provided in the socket.

When the card holding device 200 is completely inserted into the housing port, the card holding device 200 may correspond with the side surface 16 between the first surface 12 and the second surface 14 of the electronic device 100. According to an embodiment of the present disclosure, when separating the card holding device 200 from the electronic device 100, a separate separation jig may be used.

Figure 2:
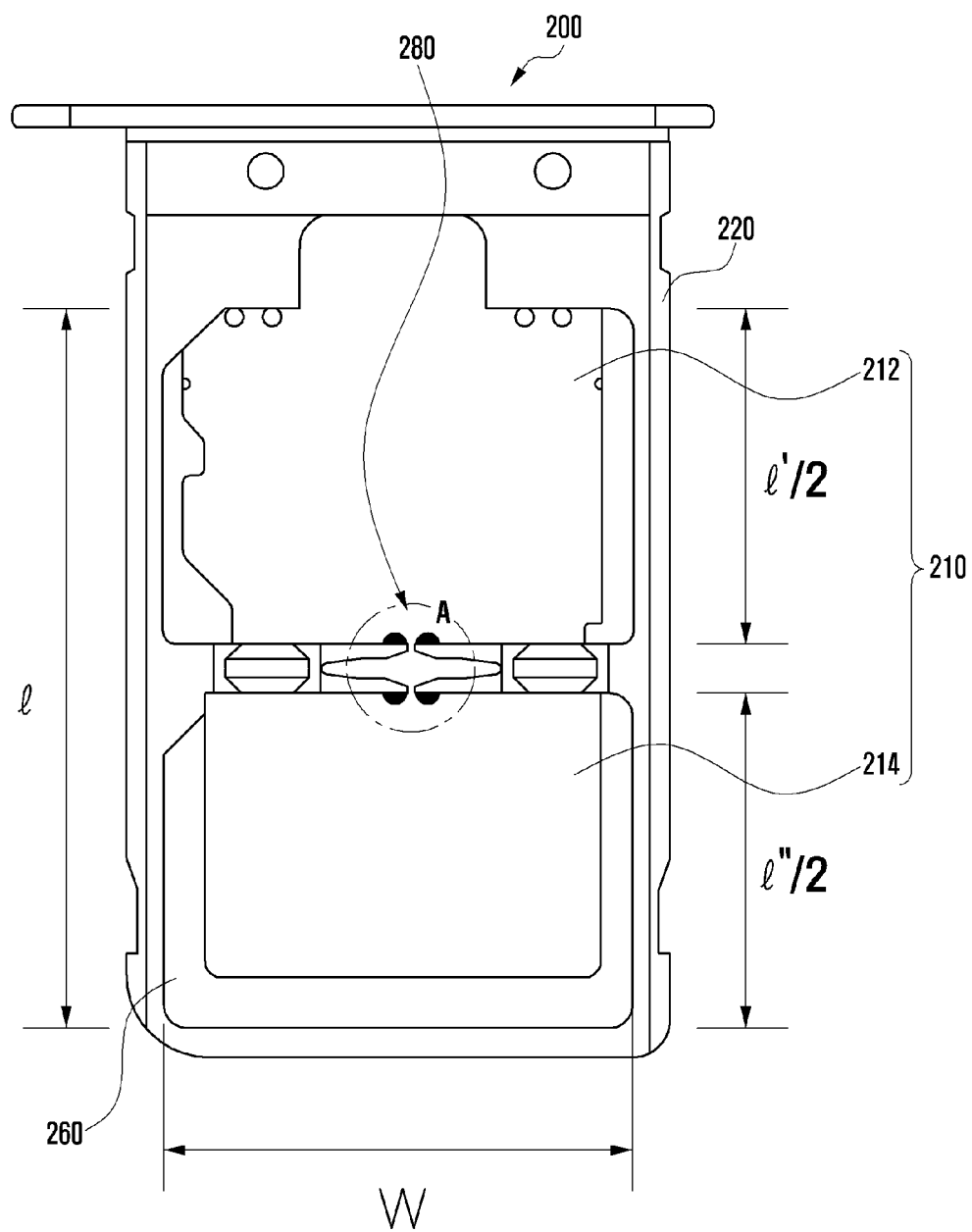
FIG. 2 is a top plan view illustrating the card holding device of FIG. 1.
Figure 3:
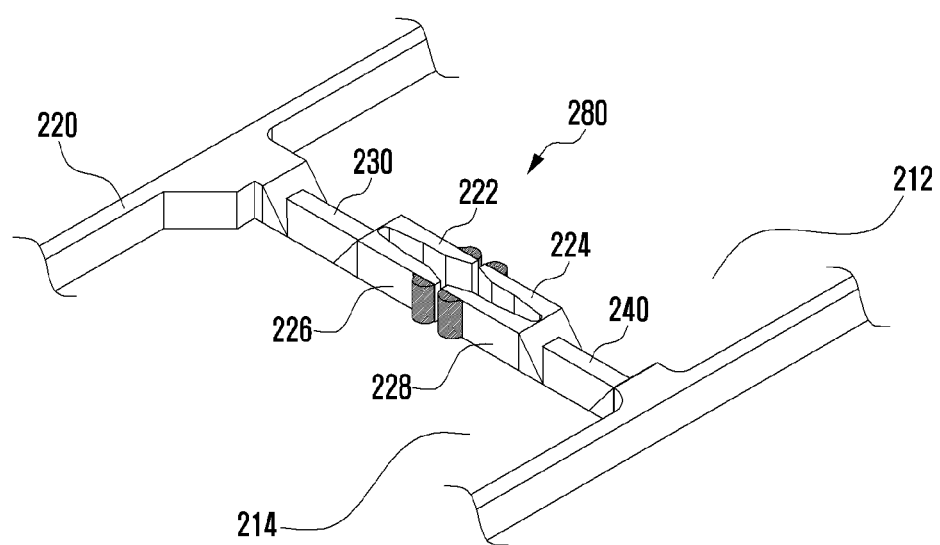
FIG. 3 is an enlarged perspective view illustrating portion A of FIG. 2.
Figure 4:
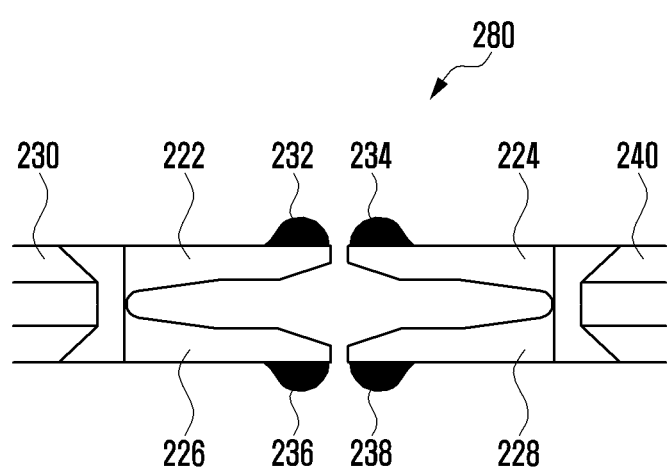
FIG. 4 is a top plan view illustrating portion A of FIG. 3.
Figure 5:
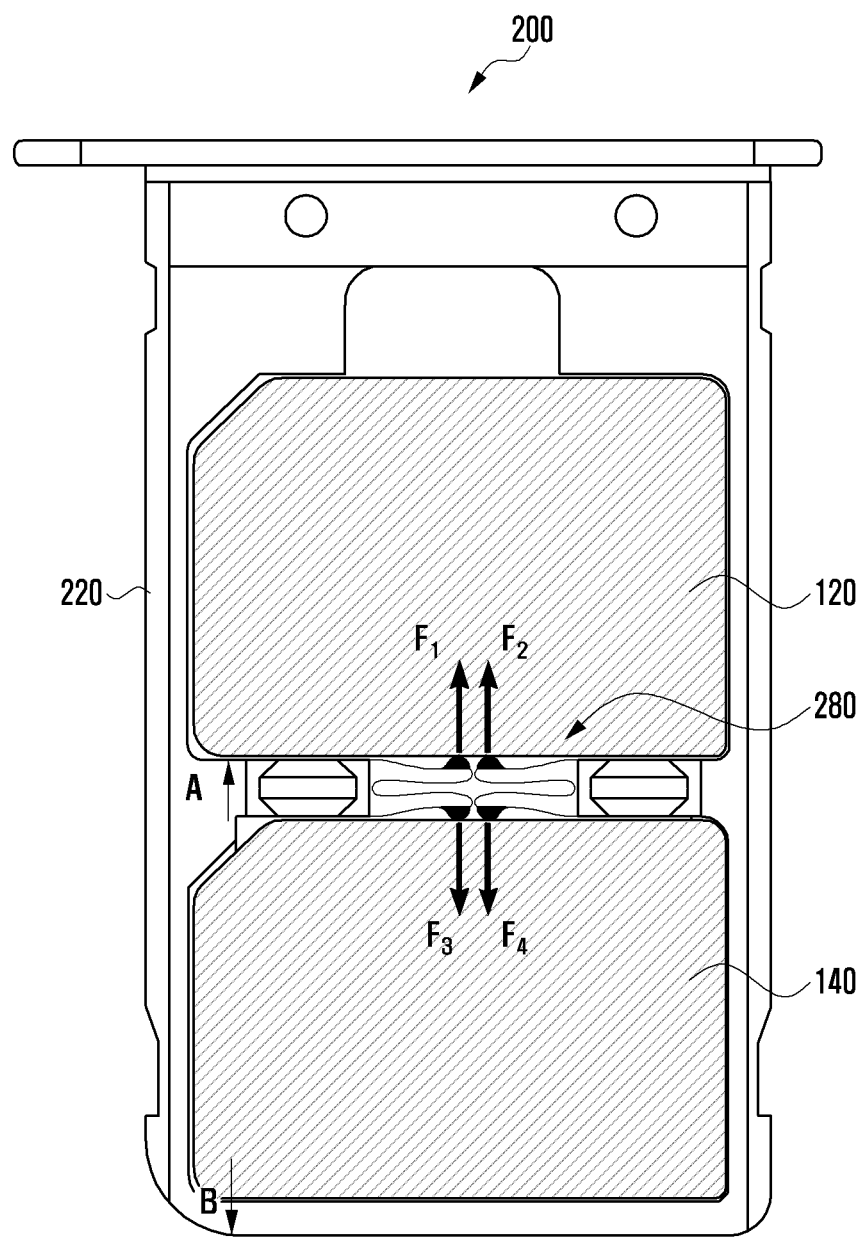
FIG. 5 is a top plan view illustrating a state in which a plurality of cards are mounted in a card mounting space of FIG. 2.
Figure 6:
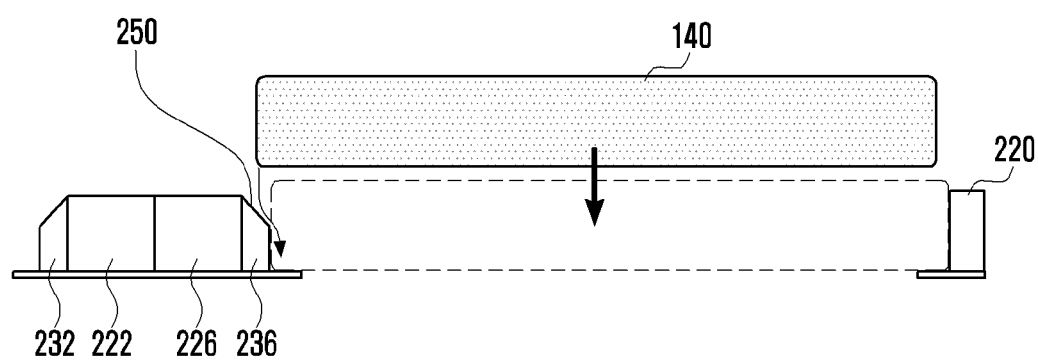
FIG. 6 is a cross-sectional view taken along line A-B of FIG. 5.

FIG. 2 is a top plan view illustrating the card holding device 200 of FIG. 1A. FIGS. 3 and 4 are enlarged views illustrating portion A of FIG. 2. FIG. 5 is a top plan view illustrating a state in which a plurality of cards are mounted at a card mounting space of FIG. 2. FIG. 6 is a cross-sectional view taken along line A-B of FIG. 5.

With reference to FIGS. 2 through 6, the card holding device 200 according to embodiments of the present disclosure may include a tray body 220 having a card receiving portion 210 opened to hold at least one card and a card support 260 protruding toward an open space of the card receiving portion 210 at the side surface and a lower portion of the tray body 220 and that presses against a card received in the card receiving portion 210.

As shown in FIG. 5, the card receiving portion 210 has a predetermined length l and width w, and receives both a first card 120 and a second card 140 which can be different sizes. FIG. 2. illustrates first card receiving portion 212 and second card receiving portion 214 for holding two different kinds of cards having a difference in size with the same width and different lengths (e.g., 1'/2 and 1"/2) that may be together used in one card tray. The card holding device 200 may selectively hold any one card from a plurality of cards.

According to an embodiment of the present disclosure, the card receiving portion 210 includes a first card receiving portion 212 in which the first card 120 (shown in FIG. 5) is inserted and received, and a second card receiving portion 214 in which the second card 140 (shown in FIG. 5) is inserted and received. The card receiving portions 212 and 214 each are shown vertically partitioned in a rectangular shape, but may be formed in any shape.

According to embodiments of the present disclosure, in the card support 260 forming a bottom surface of the tray body 220, a bottom surface thereof is made of a metal, and in order to support a card received in the card receiving portion 210 from the bottom, a front surface or a portion of the card receiving portion 210 may be blocked, and a thickness of the tray body 220 may be reduced.

In a general case, because only a portion of the card receiving portion 210 is blocked, the socket device recognizes the card under the tray body 220. According to an embodiment of the present disclosure, when a front surface of the card receiving portion 210 is blocked, in order for the socket device to recognize the card, a terminal is positioned in an upper portion of the tray body 220 to insert the card.

When the card support 260 is made of a metal, a friction coefficient between a tray injection rib and the metal contact may be lowered which will allow an elastic rib to move smoothly.

In an intermediate portion of the tray body 220 in which the card receiving portions 212 and 214 are vertically partitioned, a card elastic pressing portion 280 that can prevent movement of a card inserted and received in each of the card receiving portions 212 and 214 may be formed. According to an embodiment of the present disclosure, the card elastic pressing portion 280 may be formed in the vertically mounted tray body 220 with a metal insert method.

With reference to FIGS. 3 and 4, according to embodiments of the present disclosure, the card elastic pressing portion 280 may include left and right fixed ribs 230 and 240 horizontally extending from each side surface to the inside of the tray body 220, first to fourth elastic ribs 222, 224, 226, and 228 branched at the inside of the fixed ribs 230 and 240, respectively, and a plurality of protrusion portions 232, 234, 236, and 238 vertically protruded at the end portions of the first to fourth elastic ribs 222, 224, 226, and 228, respectively. The first and third elastic ribs 222 and 226 of the left side and the second and fourth elastic ribs 224 and 228 of the right side may be separated enough so that they do not interfere with each other.

As shown in FIGS. 2 through 5, the plurality of protrusion portions 232 to 238 may have a half-circle shape with a height of about 0.05 mm to 0.1 mm, but may have a plurality of shapes and heights.

According to embodiments of the present disclosure, the first to fourth elastic ribs 222 to 228 between the vertically partitioned card receiving portions 212 and 214 have the same length, the first elastic rib 222 and the second elastic rib 224 that branch upward may be horizontal, and the third elastic rib 226 and the fourth elastic rib 228 that branch downward may be horizontal.

The first to fourth elastic ribs 222 to 228 and the first to fourth protrusion portions 232 to 238 vertically press and push the first and second cards 120 and 140 received in the card receiving portions 212 and 214, respectively at both sides.

As shown in FIG. 5, the first card 120 is pressed upward by an elastic force F1 by the first elastic rib 222 and the first protrusion portion 232 and an elastic force F2 by the second elastic rib 224 and the second protrusion portion 234, and the second card 140 is pressed downward by an elastic force F3 by the third elastic rib 226 and the third protrusion portion 236 and an elastic force F4 by the fourth elastic rib 228 and the fourth protrusion portion 238. Thus, the first card 120 and the second card 140 may be fixed without movement, and are separated in the card receiving portions 212 and 214.

Further, according to an embodiment of the present disclosure, because the first to fourth elastic ribs 222 to 228 and the first to fourth protrusion portions 232 to 238 have the same length and shape, a force pushing the card by each elastic rib and protrusion portion may have the same value of 10-30 gf.

As shown in FIGS. 5 and 6, the first to fourth protrusion portions 232 to 238 may have an inclined surface 250 whose upper end portion is cut in a predetermined angle. When the first card 120 and the second card 140 are inserted into the card receiving portions 212 and 214, respectively, the first card 120 and the second card 140 are guided by the inclined surface 250, thereby being smoothly received in the card receiving portions 212 and 214.

Figure 7:
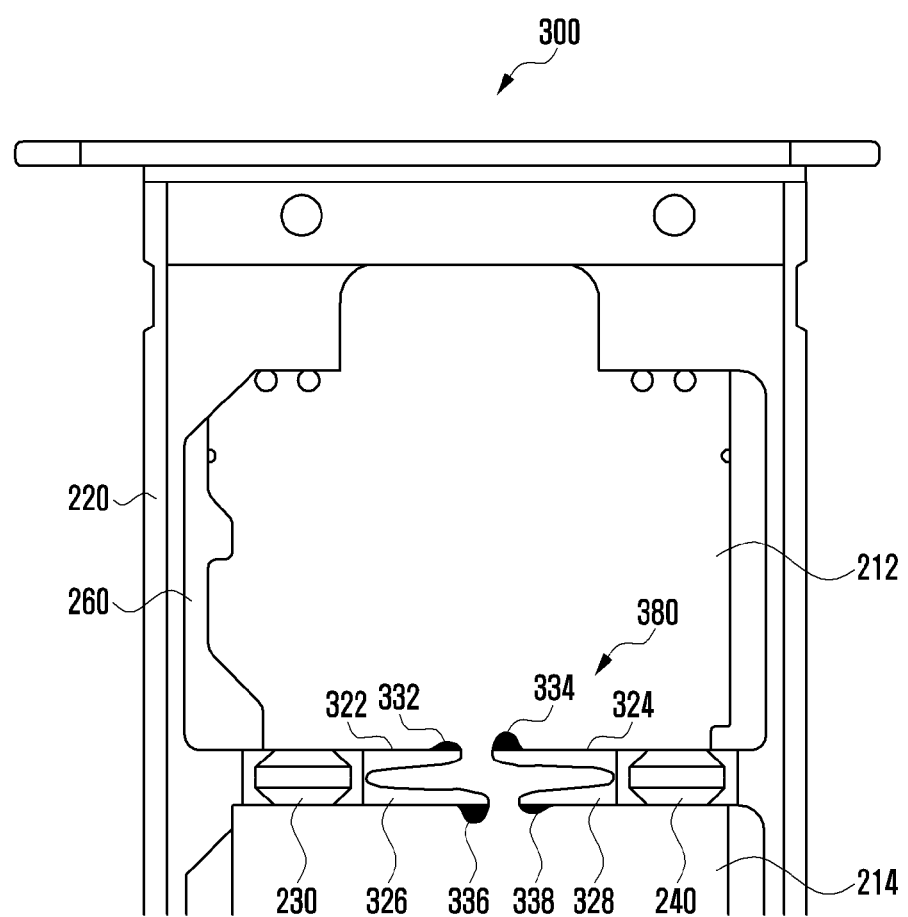
FIG. 7 is a top plan view illustrating a card holding device according to embodiments of the present disclosure.
Figure 8A:
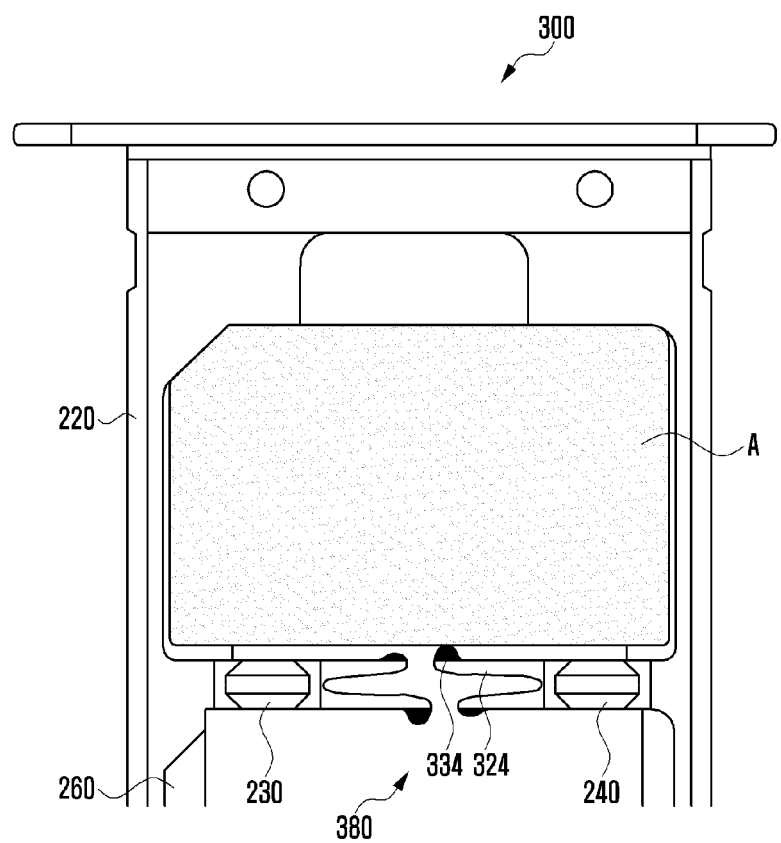
FIGS. 8A to 8C are top plan views illustrating a state in which different sizes of cards are mounted in the card holding device of FIG. 7.
Figure 8A:
Figure 8A:
Figure 8A:
Figure 8B:
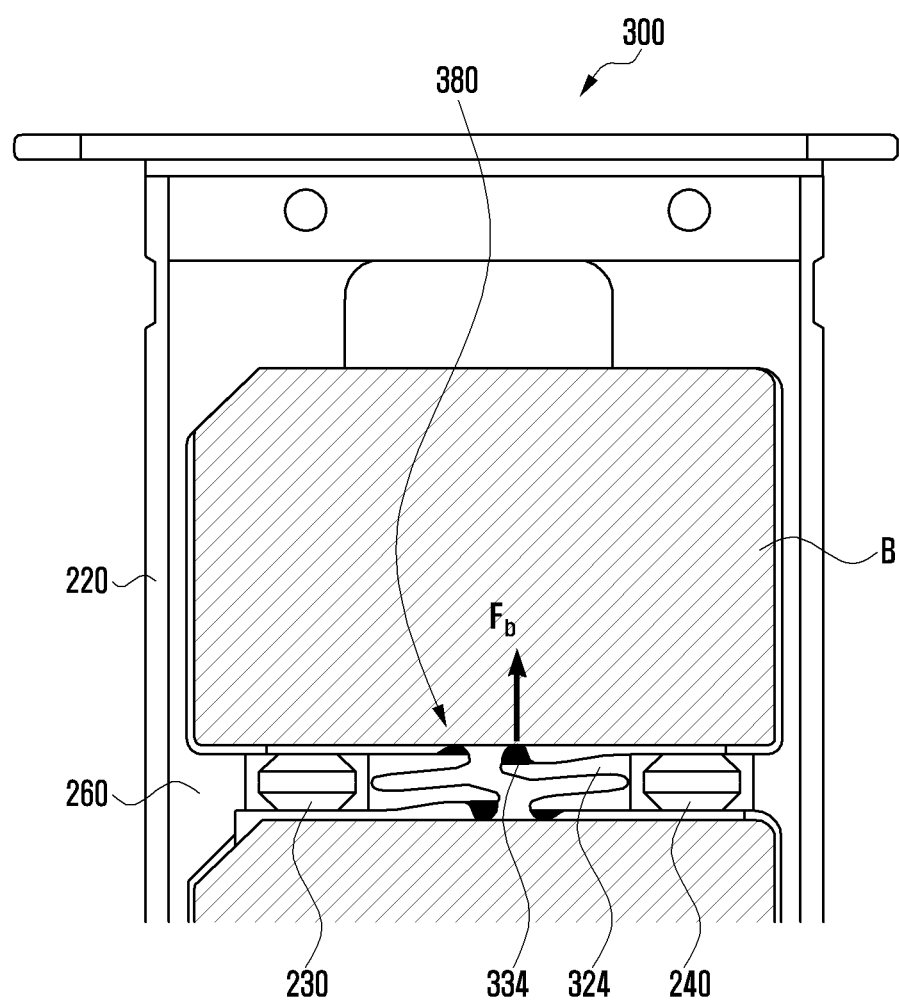
Figure 8C:
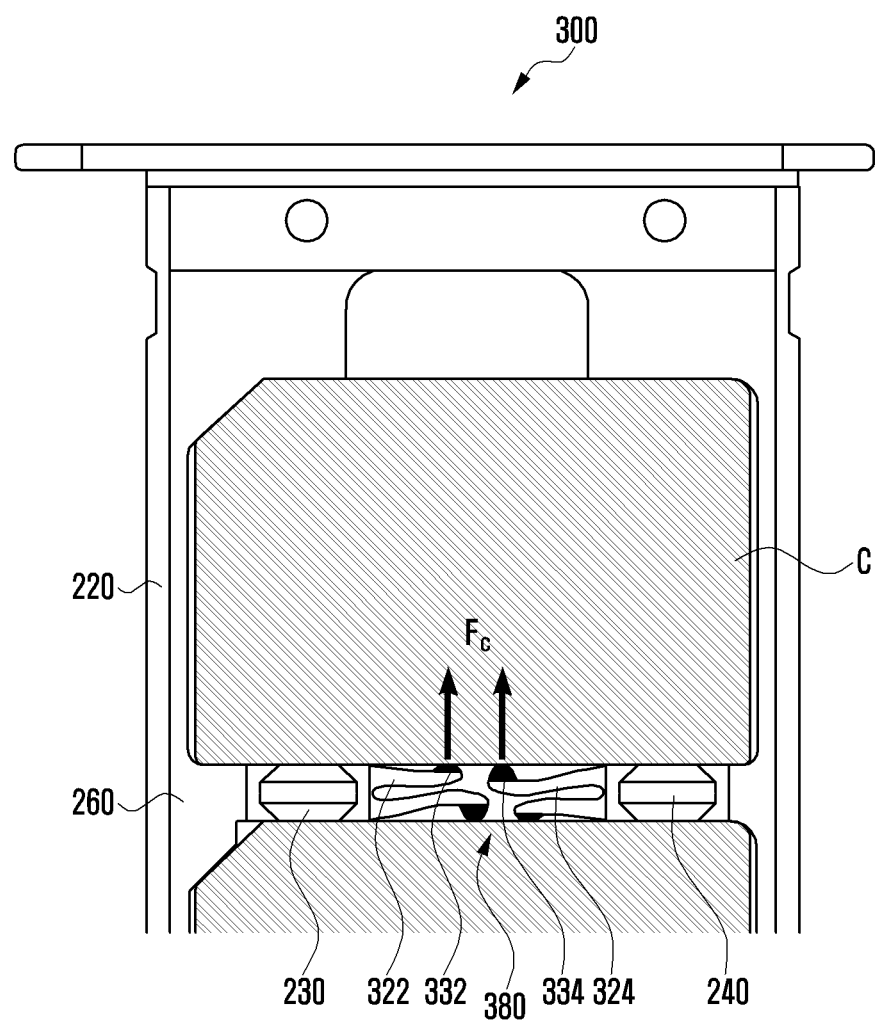

FIG. 7 is a top plan view illustrating a card holding device according to embodiments of the present disclosure, and FIGS. 8A to 8C are top plan views illustrating a state in which different sizes of cards are mounted in the card holding device of FIG. 7.

With reference to FIGS. 7, 8A, 8B, and 8C, a card holding device 300 according to embodiments of the present disclosure has the same configuration as the card holding device 200 of FIGS. 1 through 6, except for the card elastic pressing portion 280. Thus, hereinafter, only a card elastic pressing portion 380 will be described.

The card elastic pressing portion 380 of the card holding device 300 according to embodiments of the present disclosure may include left and right fixed ribs 230 and 240 horizontally extended from each side surface to the inside of the tray body 220, a first elastic rib 322 to fourth elastic rib 328 branched at the inside of the fixed ribs 230 and 240, respectively, and a plurality of protrusion portions 332, 334, 336, and 338 vertically protruding from the end portions of the first to fourth elastic ribs 322, 324, 326, and 328, respectively. The first and third elastic ribs 322 and 326 of the left side and the second and fourth elastic ribs 324 and 328 of the right side may be separated so they do not interfere with each other.

The first elastic rib 322 and the second elastic rib 324, and the third elastic rib 326 and the fourth elastic rib 328 according to embodiments of the present disclosure may have different lengths, and the first protrusion portion 332 and the second protrusion portion 334, and the third protrusion portion 336 and the fourth protrusion portion 338 may have the same height or a different height.

The first elastic rib 322 and the fourth elastic rib 328 positioned diagonally from each other may have a short length, and the second elastic rib 324 and the third elastic rib 326 positioned diagonally from each other may have a long length. Further, the first protrusion portion 332 and the fourth protrusion portion 338 formed at the end portions of the first elastic rib 322 and the fourth elastic rib 328 having a short length may have a low height of, for example, 0.03-0.05 mm, and the second protrusion portion 334 and the third protrusion portion 336 formed at the end portions of the second elastic rib 324 and the third elastic rib 326 having a long length may have a high height of, for example, 0.05-0.1 mm.

According to embodiments of the present disclosure, because the first elastic rib 322 and the fourth elastic rib 328 have a short length, the first elastic rib 322 and the fourth elastic rib 328 have good rigidity, but because the first protrusion portion 332 and the fourth protrusion portion 338 formed at the end portions of the first elastic rib 322 and the fourth elastic rib 328 have a small protrusion size, the first protrusion portion 332 and the fourth protrusion portion 338 have a low contact height. In contrast, because the second elastic rib 324 and the third elastic rib 326 have a long length, the second elastic rib 324 and the third elastic rib 326 have good flexibility, but because the second protrusion portion 334 and the third protrusion portion 336 formed at the end portions of the second elastic rib 324 and the third elastic rib 326 have a large protrusion size, the second protrusion portion 334 and the third protrusion portion 336 have a high contact height. A force in which the first elastic rib 322 and the fourth elastic rib 328 have the first and fourth protrusion portions 332 and 338, respectively, of a short length and a lower contact height push of a standard specification card may be the same as a force in which the second elastic rib 324 and the third elastic rib 326 have the second and third protrusion portions 334 and 336, respectively, of a long length and a high contact height push of a standard specification card.

As shown in FIGS. 7 and 8A, a receiving space of the first card receiving portion 212 is formed to receive a card B of a standard specification size, but when a card A that is a little smaller than a regular specification size card B is received in the first card receiving portion 212, the card A of the smaller size is supported or held by the second protrusion portion 334 formed at the end portions of the second elastic rib 324 having a long length so as not to be dropped by the effects of gravity. Thus, the received card A of the smaller size may be supported and received with a minimum of force.

Further, as shown in FIGS. 7 and 8B, when a standard specification sized card B is received in the first card receiving portion 212, the second elastic rib 324 having a long length and a high protrusion height is pushed to a position horizontal to the first elastic rib 322 by the received card. Accordingly, the first elastic rib 322 supports the standard specification size card B by contacting the card B with the first protrusion portion 332, and in this state, the card B of the standard specification size may be pressed and received with a pressing force of Fb by the second elastic rib 324 As shown in FIG. 8C, when a card C that is a little larger than the standard specification size card B is received, while the first elastic rib 322 having a short length and the second elastic rib 324 having a long length are together pushed, the card C that is a little larger than the standard specification size card B may be pressed and received with a pressing force of Fc in which a pressing force of the first elastic rib 322 and a pressing force of the second elastic rib 324 are added, while both the first protrusion portion 332 and the second protrusion portion 334 contact the card C.

Figure 9:
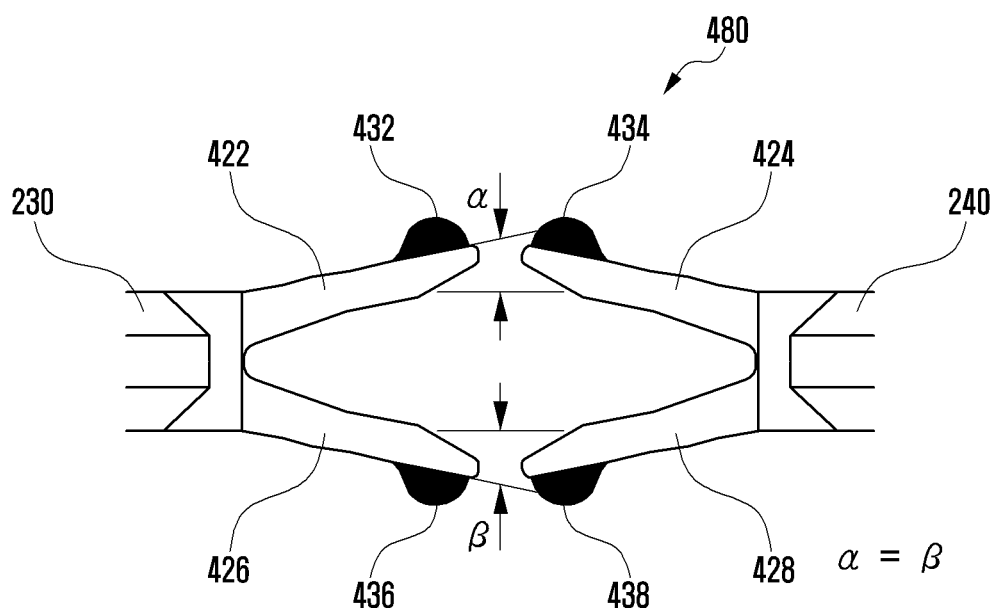
FIG. 9 is an enlarged top plan view illustrating a card holding device according to embodiments of the present disclosure.
Figure 10:
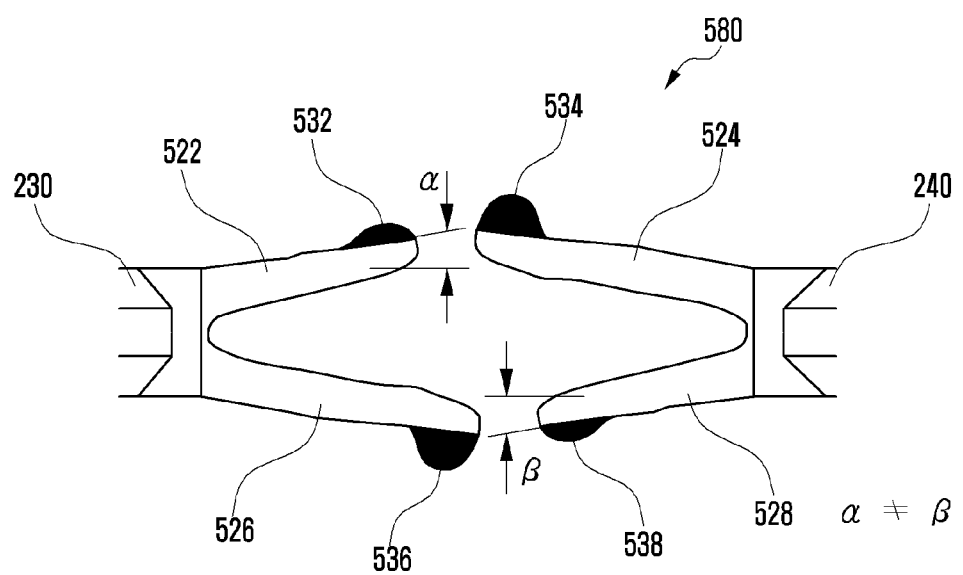
FIG. 10 is an enlarged top plan view illustrating a card holding device according to embodiments of the present disclosure.

FIGS. 9 and 10 are enlarged views illustrating a card holding device according to embodiments of the present disclosure.

As shown in FIGS. 9 and 10, a card holding device according to embodiments of the present disclosure has the same configuration as the card holding device 200 of FIGS. 1 through 6, except for the card elastic pressing portion 280. Thus, hereinafter, only card elastic pressing portions 480 and 580 will be described.

With reference to FIG. 9, the card elastic pressing portion 480 of a card holding device according to embodiments of the present disclosure may include left and right fixed ribs 230 and 240 horizontally extending from each side surface of the tray body 220 to the inside, a first elastic rib 422 to fourth elastic rib 428 radially branched to the inside in a predetermined angle at the fixed ribs 230 and 240, respectively, and a plurality of protrusion portions 432, 434, 436, and 438 vertically protruding from the end portions of the first to fourth elastic ribs 422, 424, 426, and 428, respectively. The first and third elastic ribs 422 and 426 of the left side and the second and fourth elastic ribs 424 and 428 of the right side may be separated enough so that they do not interfere with each other.

The plurality of protrusion portions 432 to 438 according to embodiments of the present disclosure may have a semi-circle shape, as shown in FIGS. 2 to 5, but may have a height of, for example, 0.03-0.05 mm lower than a height of about 0.05 mm to 0.1 mm.

Further, an angle of the first and third elastic ribs 422 and 426 vertically radially branched at the inside of the left fixed rib 230 may be the same as that of the second and fourth elastic ribs 424 and 428 vertically radially branched at the inside of the right fixed rib 240. That is, a relation of $\alpha=\beta$ may be formed.

According to embodiments of the present disclosure, the first to fourth elastic ribs 422, 424, 426, and 428 may adjust an angle radially branched at the inside of each of the fixed ribs 230 and 240 to support several kinds of cards having different sizes. When the first to fourth elastic ribs 422, 424, 426, and 428 branched from each of the fixed ribs 230 and 240 are further branched toward a receiving portion, the first to fourth elastic ribs 422, 424, 426, and 428 may push a card of a small size and support a card of a standard size or a large size with a greater pressing force.

With reference to FIG. 10, a card elastic pressing portion 580 of a card holding device according to embodiments of the present disclosure may include left and right fixed ribs 230 and 240 horizontally extending from each side surface to the inside of the tray body 220, a first elastic rib 522 to fourth elastic rib 528 radially branched in a predetermined angle at the inside of each of the fixed ribs 230 and 240, and a plurality of protrusion portions 532, 534, 536, and 538 vertically protruding from the end portions of the first to fourth elastic ribs 522, 524, 526, and 528, respectively. The first and third elastic ribs 522 and 526 of the left side and the second and fourth elastic ribs 524 and 528 of the right side may be separated enough so that they do not interfere with each other.

The first elastic rib 522 and the second elastic rib 524, and the third elastic rib 526 and the fourth elastic rib 528 according to embodiments of the present disclosure have different lengths, as shown in of FIGS. 7, 8A, 8B, and 8C, and the first protrusion portion 532 and the second protrusion portion 534, and the third protrusion portion 536 and the fourth protrusion portion 538 may have the same height or a different height.

The first elastic rib 522 and the fourth elastic rib 528 positioned diagonally from each other may have a short length, and the second elastic rib 524 and the third elastic rib 526 positioned diagonally from each other may have a long length. Further, the first protrusion portion 532 and the fourth protrusion portion 538 formed at the end portions of the first elastic rib 522 and the fourth elastic rib 528 having a short length that may have a low height, and the second protrusion portion 534 and the third protrusion portion 536 formed at the end portions of the second elastic rib 524 and the third elastic rib 526 having a long length that may have a high height.

An angle of the first and third elastic ribs 522 and 526 vertically radially branched at the inside of the left fixed rib 230 according to embodiments of the present disclosure may be different than that of the second and fourth elastic ribs 524 and 528 vertically radially branched at the inside of the right fixed rib 240. That is, a relation of $\alpha \neq \beta$ may be formed.

By mounting/removing a card in/from a tray of a mock-up sample of the card holding devices 200 and 300 according to embodiments of the present disclosure, a durability test was performed. A common standard specification card has a size of 11.0 mm, but a card in which a durability test has been performed has a wide width of 11.06 mm, 12.20 mm, 12.40 mm, and a test of total 1000 times has been performed. Of all the cards in which the test has been performed, no cracking occurred.

According to embodiments of the present disclosure, a drop and/or separation phenomenon of a card by the effects of gravity can be prevented, and even if a non-standard size of card is received, the card can be held.

According to embodiments of the present disclosure, because prevention of a drop and/or separation phenomenon of a card and receiving and holding of a non-standard size of card can be performed with only a change of a socket tray, a cracking problem of a tray injection portion fixing structure will not increase the cost. Even if a fixing structure is damaged, the card may be positioned at the center of the tray. Thus, direct damage of the socket and internal damage of a terminal can be prevented.

Although embodiments of the present disclosure have been described in detail hereinabove, it should be clearly understood that many variations and modifications of the present disclosure herein described, which may appear to those skilled in the art, will still fall within the spirit and scope of the embodiments of the present disclosure as defined by the appended claims and their equivalents.

What is claimed is:

1. A card holding device of an electronic device, comprising;
   a tray body having a card receiving portion that can receive at least one card; and
   a card elastic pressing portion configured to prevent movement of a plurality of cards inserted and received in the card receiving portion,
   wherein the card receiving portion comprises a first card receiving portion and a second card receiving portion vertically partitioned in the tray body, and a first card and a second card are inserted and received in the first card receiving portion and the second card receiving portion, respectively,
   wherein the card elastic pressing portion is formed between the first card receiving portion and the second card receiving portion, and vertically partitioned in the tray body, and
   wherein the card elastic pressing portion comprises:
   a pair of fixed ribs horizontally extending towards the inside of the tray body;
   first to fourth elastic ribs branched from the fixed ribs towards the inside; and
   a plurality of protrusion portions vertically protruding from end portions of the first to fourth elastic ribs.

2. The card holding device of claim 1, wherein a plurality of different cards having different sizes can be received in the card receiving portion having a predetermined length l and width w.

3. The card holding device of claim 1, further comprising a card support portion protruding from the tray body toward an open space of the card receiving portion to support a card received in the card receiving portion,
   wherein the card support portion has a bottom surface made of a metal in order to support a card received in the card receiving portion from the bottom.

4. The card holding device of claim 1, wherein the card elastic pressing portion is formed in the tray body with a metal insert method.

5. The card holding device of claim 1, wherein the first to fourth elastic ribs are of the same length,
   the first elastic rib and the second elastic rib are branched upward to be at the same horizontal level with each other, and
   the third elastic rib and the fourth elastic rib are branched downward to be at the same horizontal level with each other.

6. The card holding device of claim 1, wherein the first and fourth elastic ribs are of a first length, and the second and third elastic ribs are of a second length, the second length being greater than the first length, and
   the first and second elastic ribs are branched upward to be at the same horizontal level with each other, and the third and fourth elastic ribs are branched downward to be at the same horizontal level with each other.

7. The card holding device of claim 1, wherein the plurality of protrusion portions formed in the first to fourth elastic ribs have a semi-circle shape of the same predetermined height.

8. The card holding device of claim 6, wherein a first protrusion portion and a fourth protrusion portion formed in end portions of the first elastic rib and the fourth elastic rib, respectively, are of a first height, and a second protrusion portion and a third protrusion portion formed in end portions of the second elastic rib and the third elastic rib, respectively, are of a second height, and wherein the second height is greater than the first height.

9. The card holding device of claim 1, wherein the card elastic pressing portion comprises:

a pair of fixed ribs horizontally extending towards the inside of the tray body;

first to fourth elastic ribs branched of the fixed ribs towards the inside in a predetermined angle; and a plurality of protrusion portions vertically protruding from end portions of the first to fourth elastic ribs.

10. The card holding device of claim 9, wherein an angle formed by the first and third elastic ribs with respect to a fixed rib of the pair of fixed ribs is the same as an angle formed by the second and fourth elastic ribs with respect to another fixed rib of the pair of fixed ribs.

11. The card holding device of claim 10, wherein the plurality of protrusion portions formed in the first to fourth elastic ribs have a semi-circle shape of the same predetermined height.

12. The card holding device of claim 9, wherein an angle formed by the first and third elastic ribs with respect to a fixed rib of the pair of fixed ribs is different from an angle formed by the second and fourth elastic ribs with respect to another fixed rib of the pair of fixed ribs.

13. The card holding device of claim 12, wherein a first protrusion portion and a fourth protrusion portion formed in end portions of the first elastic rib and the fourth elastic rib, respectively, are of a first height, and a second protrusion portion and a third protrusion portion formed in end portions of the second elastic rib and the third elastic rib, respectively, are of a second height, and wherein the second height is greater than the first height.

14. The card holding device of claim 1, wherein an upper end portion of each of the protrusion portions has an inclined surface cut in a predetermined angle.

15. An electronic device, comprising:

a first surface comprising a display;

a second surface facing the first surface;

a side surface, between the first surface and the second surface, in which a receiving port is installed; and a card holding device inserted into the receiving port, wherein the card holding device comprises:

a tray body having a card receiving portion that can receive at least one card;

a card support portion protruding from the tray body toward the card receiving portion to support a card received in the card receiving portion; and a card elastic pressing portion configured to prevent movement of a plurality of cards inserted and received in the card receiving portion, and wherein the card elastic pressing portion comprises:

a pair of fixed ribs horizontally extending towards the inside of the tray body;

first to fourth elastic ribs branched from the fixed ribs towards the inside; and a plurality of protrusion portions vertically protruding from end portions of the first to fourth elastic ribs.

16. The electronic device of claim 15, further comprising:

a pair of fixed ribs horizontally extending towards the inside of the tray body;

first to fourth elastic ribs radially branched from the fixed ribs toward the inside at a predetermined angle; and a plurality of protrusion portions vertically protruding from end portions of the first to fourth elastic ribs.

* * * * *